(12) United States Patent
Peh

(10) Patent No.: US 7,145,182 B2
(45) Date of Patent: Dec. 5, 2006

(54) INTEGRATED EMITTER DEVICES HAVING BEAM DIVERGENCE REDUCING ENCAPSULATION LAYER

(75) Inventor: Thomas Kheng G. Peh, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 84 days.

(21) Appl. No.: 10/661,054

(22) Filed: Sep. 12, 2003

(65) Prior Publication Data

US 2005/0056854 A1    Mar. 17, 2005

(51) Int. Cl.
*H01L 33/00* (2006.01)
(52) U.S. Cl. .................... 257/98; 257/79; 257/E33.068
(58) Field of Classification Search ................. 257/98, 257/99, 100
See application file for complete search history.

(56) References Cited

U.S. PATENT DOCUMENTS

| 5,119,174 A | 6/1992 | Chen |
| 6,355,946 B1 * | 3/2002 | Ishinaga |
| 6,638,780 B1 * | 10/2003 | Fukasawa et al. |
| 6,642,547 B1 * | 11/2003 | Matsubara et al. |

* cited by examiner

*Primary Examiner*—Nathan J. Flynn
*Assistant Examiner*—Kevin Quinto

(57) ABSTRACT

In one embodiment, a method for fabricating an integrated emitter device occurs on a flat substrate such as printed circuit board (PCB). A cup of suitable material such as epoxy is transfer molded on top of the substrate. An emitter is attached to the substrate within the epoxy cup. Wire bonding may occur to provide a path to the emitter. An epoxy encapsulation layer is provided to encapsulate the emitter. The encapsulation layer may be shaped to provide a lens for the emitter.

10 Claims, 2 Drawing Sheets

US 7,145,182 B2

INTEGRATED EMITTER DEVICES HAVING BEAM DIVERGENCE REDUCING ENCAPSULATION LAYER

TECHNICAL FIELD

The present invention is directed to fabrication of an integrated emitter device.

BACKGROUND OF THE INVENTION

Light emitting diodes (LED) may be packaged according to a number of known designs to form LED devices. As an example, a known packaging methodology has been developed in which a recess is created by drilling a hole in a printed circuit board (PCB). Then, a layer of reflective metal is deposited on the recess to provide a reflective surface, i.e. to direct the emitted light from the LED in an outward direction. The LED die may be attached within the recess. Wire bonding may occur to provide a current path to the LED. Transparent epoxy may be transfer molded over the LED die. The molded epoxy may protect the LED die from damage and contaminants. Also, the molded epoxy may be provided a lens-like shape to act as a rudimentary waveguide. An example of an LED device assembled utilizing this technique is shown in U.S. Pat. No. 5,119,174.

LED devices manufactured according to printed circuit board machining suffer from a number of disadvantages. The assembly methodology is inaccurate due to inability to control the dimension, depth, and position of the recess with a relatively high degree of accuracy. Furthermore, the printed circuit board machining process is relatively costly. Specifically, the necessity of a special purpose drill with a precise shape for the recess and a high reject rate contributes to relatively high cost associated with this fabrication technique. Further, the machining process only creates a circular shape thereby limiting the viewing angle. The reflective metal layer deposited on the recess does not have suitable adhesive strength with the transparent epoxy that is used to encapsulate the die and provide a lens. The lack of adhesive strength may result in de-lamination between the epoxy and the surface reflector when the epoxy shrinks after curing, during high temperature operation, and/or the like. The de-lamination may result in lifted LED die and other problems.

BRIEF SUMMARY OF THE INVENTION

Representative embodiments may provide a method for fabrication of an integrated emitter device. The method may form cups of epoxy or other suitable material to receive an emitter where the cups are formed on a flat printed circuit board or other suitable substrate. Transfer molding may be utilized to form the cups that will each receive an emitter. Wire bonding is performed to provide a signal path to each emitter. Transfer molding is performed to provide a lens and an encapsulation structure for each emitter. The fabrication process may occur in a less expensive manner than known fabrication processes. Moreover, the bonding of the material forming the cup to the material forming the encapsulation structure is improved relative to known designs. Also, a range of viewing angles of the integrated emitter device is enabled by suitably shaping the cup and/or the encapsulation layer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 1:
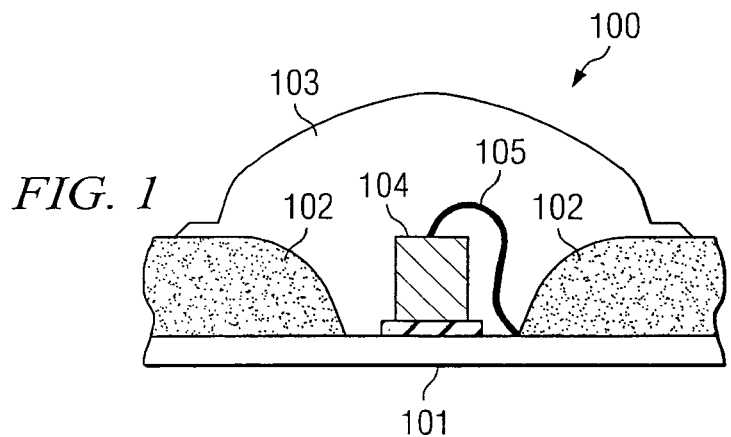
FIG. 1 depicts an integrated emitter device according to representative embodiments.

Referring now to the drawings, FIG. 1 depicts a cross section view of integrated emitter device 100 according to representative embodiments. Integrated emitter device 100 is a surface mount technology device. That is, the functional components of integrated emitter device 100 are mounted on substrate 101. Substrate 101 may be formed utilizing known implementations such as a printed circuit board (PCB), a ceramic substrate, and/or the like. Integrated emitter device 100 includes molded cup 102. Molded cup 102 may be formed from epoxy, resin, polymer, and/or any other suitable material. In one embodiment, the material selected for molded cup 102 includes a suitable substance or pigment that causes molded cup 102 to be at least semi-reflective. Molded cup 102 is bonded to substrate 101. Integrated emitter device 100 includes emitter 104 mounted to substrate 101 within the recess defined by molded cup 102. Integrated emitter device 100 also includes wire bond 105 to provide a suitable circuit path to emitter 104. The semi-reflective characteristic of molded cup 102 may direct light emitted from emitter 104 in an outward direction. Integrated emitter device 100 further includes encapsulation layer 103 (e.g., of clear epoxy) that is shaped to act as a rudimentary lens. Molded cup 102 exhibits advantageous bonding characteristics to substrate 101 and encapsulation layer 103 thereby facilitating the structural integrity of integrated circuit device 100.

Figure 2:
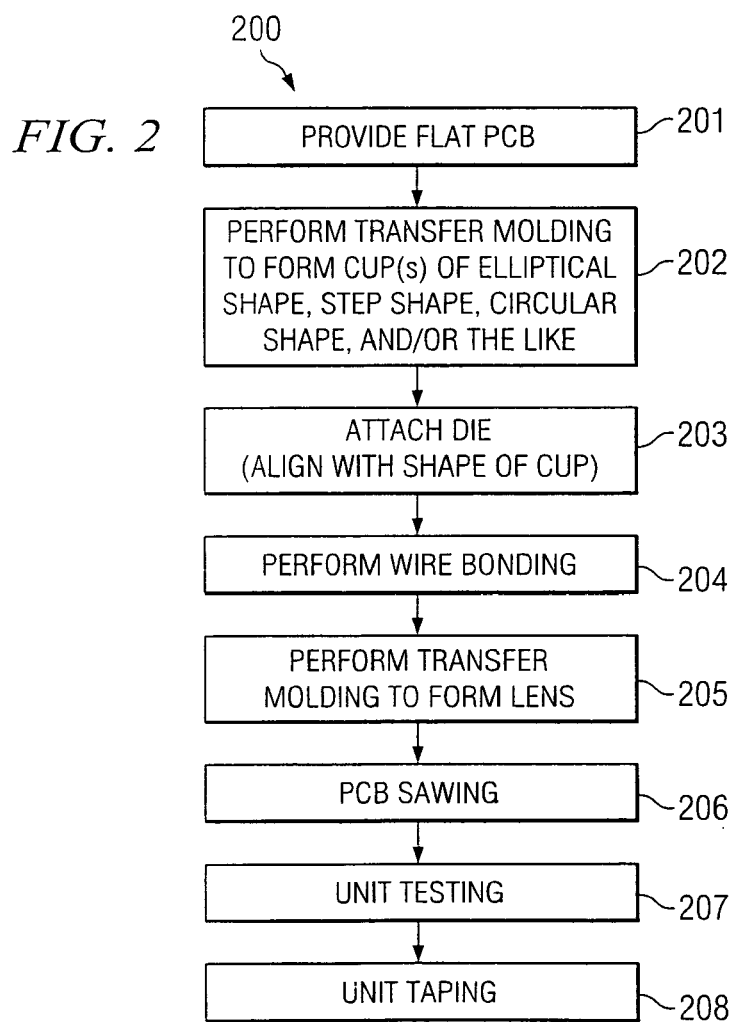
FIG. 2 depicts a flowchart for fabrication of an integrated emitter device according to representative embodiments.

FIG. 2 depicts a flowchart for fabricating an integrated emitter device, such as integrated emitter device 100, according to representative embodiments. In step 201, a suitable substrate (e.g., a flat printed circuit board (PCB), a ceramic substrate, and/or the like) is provided. In step 202, transfer molding is performed to provide one or several cups that will each receive an emitter. The cups may possess an elliptical shape, a circular shape, and/or the like. The walls of the cups may be substantially linear. Alternatively, the walls of the cups may possess a plurality of discrete transitions. The epoxy, resin, polymer, or other suitable material utilized for the cups may include suitable material or pigment to cause the cups to be at least semi-reflective. In step 203, an emitter (such as a surface emitting diode, an edge emitting diode, and/or the like) is attached within each cup formed in step 202. The emitter may be aligned with the shape of the cup. In step 204, wire bonding is performed to provide a signal path to each emitter. In step 205, transfer molding is performed to provide a lens and an encapsulation structure for each emitter. The molded encapsulation structure advantageously bonds with the molded cup thereby facilitating the structural integrity of the integrated emitter device. In step 206, substrate sawing may occur if desired. In step 207, unit testing may be performed. In step 208, unit taping may occur to place finished products in sockets of a plastic reel. Unit taping is a common industrial technique for housing surface mount technology (SMT) devices. The unit taping process includes placing the units into the sockets of carrier tape, providing cover tape, and reeling the units into the plastic reel.

Figure 3:
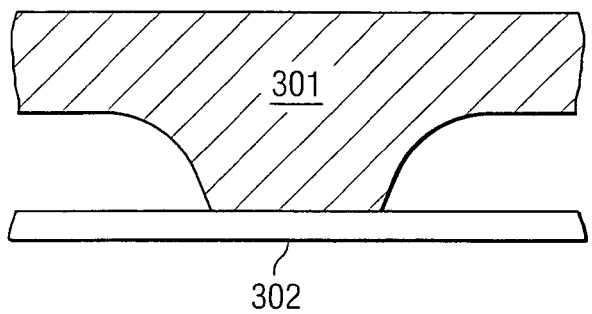
FIG. 3 depicts a mold tool positioned relative to a printed circuit board to form a molded cup according to representative embodiments.
Figure 4:
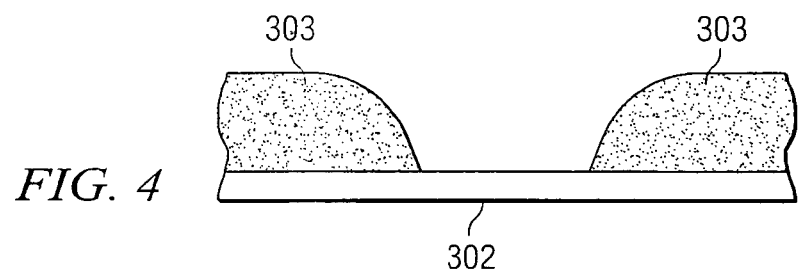
FIG. 4 depicts a molded cup formed according to representative embodiments.
Figure 5:
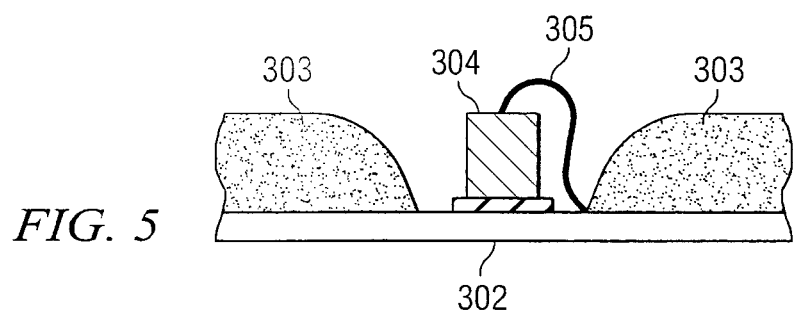
FIG. 5 depicts an emitter attached within a molded cup according to representative embodiments.
Figure 6:
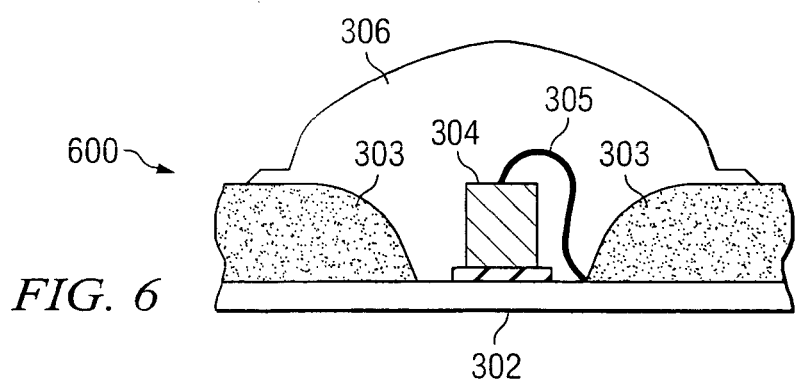
FIG. 6 depicts an integrated emitter device fabricated according to representative embodiments.

FIGS. 3–6 depict cross-sectional views of a plurality of fabrication stages for an integrated emitter device according to representative embodiments. In FIG. 3, mold tool 301 is positioned where the emitter will be subsequently attached on printed circuit board 302. Mold tool 301 possesses a shape that is complementary to the desired cup shape. By utilizing mold tool 301 to define the shape of the cup, representative embodiments may provide a range of viewing angles as appropriate for a particular application. Alternatively, an elliptical shape may be formed depending upon the desired application for the integrated emitter device. FIG. 4 depicts epoxy molded cup 303 attached to printed circuit board 302. FIG. 5 depicts emitter 304 attached to printed circuit board 302 and wire 305 bonded to emitter 304. FIG. 6 depicts completed integrated emitter device 600. Clear molded epoxy 306 encapsulates emitter 304. Moreover, clear molded epoxy 306 may be shaped to form a lens to direct the light emitted from emitter 304 as desired.

As previously noted, the shape of the cup may be elliptical. When the shape of the cup is elliptical, the lens of the encapsulation layer may be formed in an elliptical manner also. As is known in the art, the divergence of the emitted beam from known emitters is appreciably greater in the "fast-axis" than the "slow-axis." In representative embodiments, the emitter may be aligned when attached to substrate according to the elliptical shape of the cup and of the subsequent encapsulation layer. Accordingly, representative embodiments enable an elliptical lens in the encapsulation layer to partially compensate for the difference in divergence in the two axes. Specifically, the radius of curvature associated with the fast-axis may be greater than the radius of curvature associated with the slow-axis thereby causing the difference in the divergence to be reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated optical emitter device, comprising:
   a substrate;
   an emitter mounted to said substrate;
   a molded cup that surrounds said emitter and that is bonded to said substrate; and
   a molded encapsulation layer that encapsulates said emitter and that is bonded to said molded cup, wherein said molded encapsulation layer is shaped to direct light emitted by said emitter such that the molded encapsulation layer reduces a difference in beam divergence between a fast-axis and a slow-axis of said emitter.

2. The integrated optical emitter device of claim 1, wherein said substrate is a printed circuit board.

3. The integrated optical emitter device of claim 1, wherein said emitter is selected from the list consisting of: an edge emitting diode and a surface emitting diode.

4. The integrated optical emitter device of claim 1 wherein said molded cup and molded encapsulation layer are formed of molded epoxy.

5. The integrated optical emitter device of claim 1 wherein said molded cup is at least semi-reflective.

6. The integrated optical emitter device of claim 1 wherein said molded encapsulation layer is elliptical.

7. The integrated optical emitter device of claim 1 wherein said encapsulation layer is formed from clear epoxy.

8. The integrated optical emitter device of claim 1 wherein said molded cup possesses a plurality of discrete transitions.

9. An integrated optical emitter device, comprising:
   a printed circuit board (PCB);
   an emitter mounted to said PCB;
   a molded epoxy cup that surrounds said emitter and that is bonded to said PCB, wherein said molded epoxy cup is at least semi-reflective; and
   a molded epoxy encapsulation layer that encapsulates said emitter and that is bonded to said molded epoxy cup, wherein said molded encapsulation layer is shaped to direct light emitted by said emitter such that the molded encapsulation layer reduces a difference in beam divergence between a fast-axis and a slow-axis of said emitter.

10. The integrated optical emitter device of claim 9, wherein said molded encapsulation layer is elliptical.

* * * * *